United States Patent [19]

Jekel

[11] Patent Number: 5,508,652
[45] Date of Patent: Apr. 16, 1996

[54] TRANSISTOR SWITCHING CIRCUIT

[75] Inventor: Mark R. Jekel, Baltimore, Md.

[73] Assignee: Westinghouse Elec. Corp., Pittsburgh, Pa.

[21] Appl. No.: 274,513

[22] Filed: Jul. 13, 1994

[51] Int. Cl.$^6$ ................................................. H03K 17/687
[52] U.S. Cl. ........................... 327/427; 327/403; 327/404
[58] Field of Search ..................................... 327/108, 109, 327/110, 111, 389, 403, 404, 405, 443, 482, 489, 492, 520, 521, 427; 323/272; 363/17, 132

[56]  References Cited

U.S. PATENT DOCUMENTS

| | | | |
|---|---|---|---|
| 3,699,358 | 10/1972 | Wilkinson | 327/405 |
| 4,567,379 | 1/1986 | Corey et al. | 327/482 |
| 4,791,542 | 12/1988 | Piaskowski | 363/17 |

Primary Examiner—Timothy P. Callahan
Assistant Examiner—Jeffrey Zweizig

[57] ABSTRACT

A switching circuit that includes two parallel connected switching transistors. A primary winding of a transformer is connected across the drain electrodes of each of the switching transistors and a secondary winding of the transition transformer is connected to the gate electrodes of the transistor. A capacitor is connected in series with the primary winding to isolate the primary winding from the switching circuit when in a steady state operation. The secondary winding shorts the commonly connected gate electrodes in the steady state condition. The differential in voltage between the drain electrodes is used to activate the primary winding of the transformer which induces a correction voltage in the secondary winding to cause the transistors to operate at the same rate.

8 Claims, 9 Drawing Sheets

TRANSISTOR SWITCHING CIRCUIT

BACKGROUND OF THE INVENTION

1. Technical Field

The present invention relates to transistor switching circuits; and more particularly, to a power switching circuit utilizing a plurality of parallel connected switching transistors.

2. BACKGROUND ART

The advancement in power electronics depends upon the power switch device technology. Because of transistor switching limitations, it is sometimes necessary, in high power applications, to parallel the switching transistors in order to obtain the desired current carrying capability. When paralleling a plurality of transistor switches, mismatches in the characteristics of individual transistors can cause the devices to share the current improperly. This results in one or more of the transistors being overloaded, which, in turn, causes failure of the switching circuit. In order to prevent one of the transistor switches from carrying more than it's share of the total current, it is well known to use ballasting resistors in series with each of the parallel connected transistors to force current sharing. The series connected ballast resistors provide for sharing the current in the switch on-state, but do not force the sharing during the transition period between the on and off conditions of the switch. If one transistor turns on faster than the other, and conversely if one transistor turns off slower than the other, then the switching device can be destroyed due to inordinate transition current slugs.

Although it is recognized that successful paralleling can be achieved due to the use of advanced packaging, careful layout, homogeneous dice and good thermal management without the use of ballast resistors, it is difficult to prove that current sharing will occur well enough to guarantee that the devices will always operate within specified limits.

In light of the foregoing, there is a need for a power transistor switching device where parallel connected transistors share the current equally not only during the on o state of the parallel connected transistors, but also during the transition between the on and off states of the switching devices.

DISCLOSURE OF THE INVENTION

Accordingly, the present invention is directed to a method and circuit that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof as well as the appended drawings.

To achieve these and other advantages and in accordance with the purpose of the invention, as embodied and broadly described, the invention is a method of force sharing current in a plurality of parallel connected transistor switches during transition between an off and on state. The method comprises activating a primary winding of the transformer that is connected across respective corresponding elements of the plurality of transistor switches in response to a differential voltage between load nodes of the switches; and equalizing a rate of change in the plurality of transistors during the transition in response to an inductance in a secondary winding of the transformer that is connected across gating elements of the plurality of transistors.

In another aspect, the invention is a transistor switching circuit that includes a plurality of transistor switches, each having a first element and a second element for completing a circuit when the transistor is on and for interrupting a circuit when the transistor is off. Each of the transistors has a third element for selectively switching the transistor to an on and off state. A first node of the circuit commonly connects electrically the first elements of the plurality of transistors. A second node of the circuit commonly connects electrically the second elements of the plurality of transistors; and a third node of the circuit commonly connects electrically the third elements of the plurality of transistors. A transformer having a primary winding in series with a capacitor is connected at one end to the first element of one of the plurality of transistors and at the opposite end to the first element of another of the plurality of transistors. The transformer also has a secondary winding connected at one end to the third element of one of the plurality of transistors and at the opposite end to the third element of the other of the plurality of transistors.

BRIEF DESCRIPTION OF THE DRAWINGS

The graphs shown herein are the result of a computer simulation.

BEST MODE FOR CARRYING OUT THE INVENTION

Figure 1:
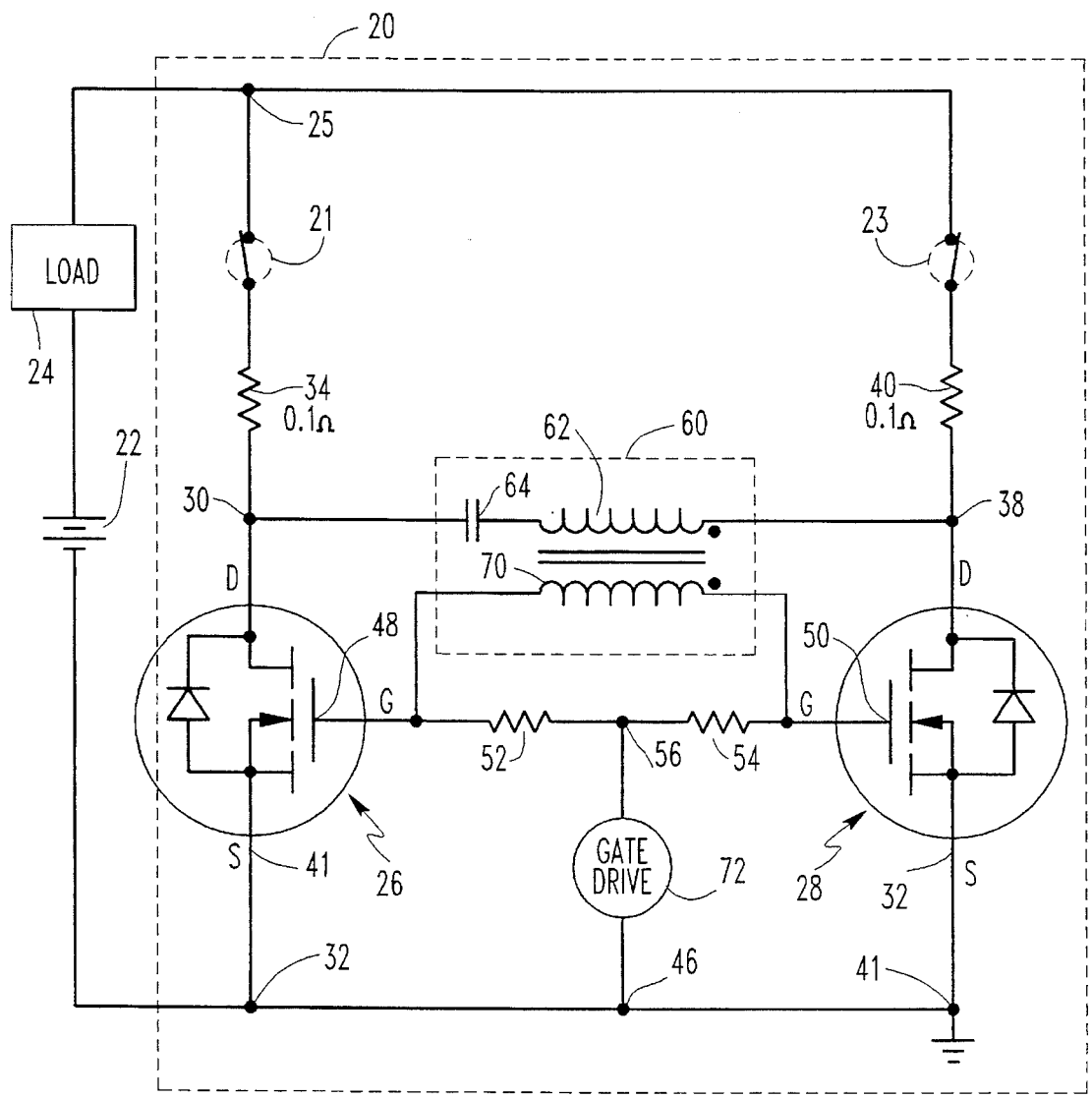
FIG. 1 is a schematic circuit diagram of a switching circuit in accordance with one embodiment of the present invention.

Reference will now be made in detail to the present preferred embodiment of the invention, an example of which is illustrated in FIG. 1 of the accompanying drawings. The exemplary embodiment of the power switching circuit of the present invention is contained within the dashed lines designated generally by reference numeral 20. The several locations in the circuit having a circle with dashed lines do not represent components. For example, circles 21 and 23 represent stray inductance in the circuits. The switching circuit 20 is connected across a DC power source 22 and a load 24. The circuit 20 has a plurality of transistor switches, each having a first element and a second element for completing a circuit when the transistor is on and for interrupting a circuit when the transistor is off. Each said transistor has third element for selectively switching the transistors on and off. As herein embodied, the circuit 20 has a transistor 26 and a transistor 28. The transistor 26 has a drain terminal 30 and a source terminal 32. The drain terminal 30 is connected through a ballast resistor 34, a node 25, and the positive side of the source 22 through the load 24. The source terminal 32 of the transistor 26 is connected to the negative terminal of the power source 22. Thus, when the transistor 26 is conducting, a circuit is completed from the power source 22 through the load 24, the ballast resistor 34, the drain terminal 30 of the transistor 26, the source terminal 32 and the negative terminal of the battery 22.

Similarly, the transistor 28 has a drain terminal 38 connected to the load 24 through a ballast resistor 40. The transistor 28 has a source terminal 41 connected to the negative terminal of the battery 22. Also, when the transistor 28 is conducting, a circuit is completed from the load 24 through the ballast resistor 40, the transistor 28, and the negative terminal of the batter 22.

Thus, the drain terminals 30 and 38 of the transistors 26 and are commonly connected electrically through ballast resistors 34 and 40 at a node 25; and the source terminals 32 and 41 are commonly connected electrically at a node 46. The transistor 26 has a gate element 48; and the transistor 28 has a gate element 50. The gate element 48 and 50 are commonly connected through resistors 52 and 54 at a node 56.

In accordance with the invention, a transformer having a primary winding in series with a capacitor is connected at one end to the drain of one of the plurality of transistors and at the opposite end to the drain of another of the plurality of transistors. As herein embodied, a transformer 60 has a primary winding 62 connected in series with a capacity 64 to the drain 30 of the transistor 26. The primary winding 62 is also connected directly to the drain 38 of the transistor 28 between the ballast resistor 40 and the transistor 28.

In accordance with the invention, the transformer has a secondary winding connected at one end to the gate element of one of the plurality of transistors and the opposite end to the gate element of the other of the plurality of transistors. As embodied herein, the transformer 60 has a secondary winding 70 connected at one end to the gate element 48 and at the opposite end to the gate element 50 of the transistors 26 and 28 respectively The transistors 26 and 28 are turned on and off by the selective application of a voltage to a base drive circuit 72. According to one embodiment of the invention, the ballast resistors 34 and 40 have a value of one-tenth of an ohm.

In explaining the principles of the present invention, it is to be assumed that the transistor 26 is slightly slower than the transistor 28 and the stray inductances 21 and 23 each have a value of one-tenth of a microhenry.

Figure 2:
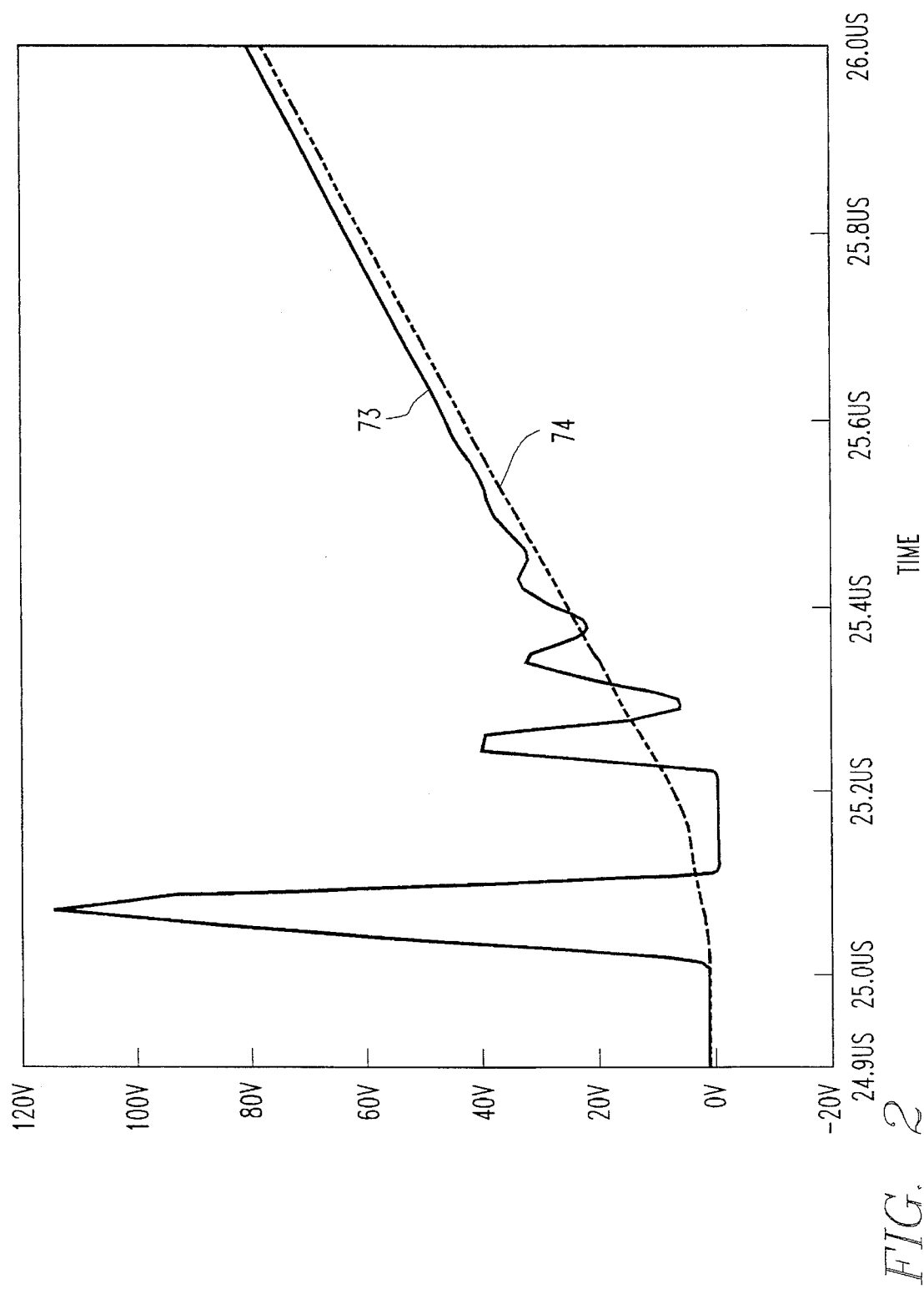
FIG. 2 is a timing diagram showing the voltage on the drain terminals of the transistors of FIG. 1 during a turnoff transition without the benefit of the present invention.

Referring to FIG. 2, and without the benefit of the transformer 60 being connected, the voltage of drain terminal 30 of the transistor 28 represented by line 73 jumps to almost 120 volts during a turn off transition. Transistor 28 rings during the initial part of the switching because of it's higher speed. Notice that transistor 28, having reached steady state, has a higher drain voltage throughout the transition because it has lower current. Transistor 26 is hogging current during this region. The voltage at the drain terminal 30 of the transistor 26 as represented by line 74 is conducting on a steady line.

Figure 3:
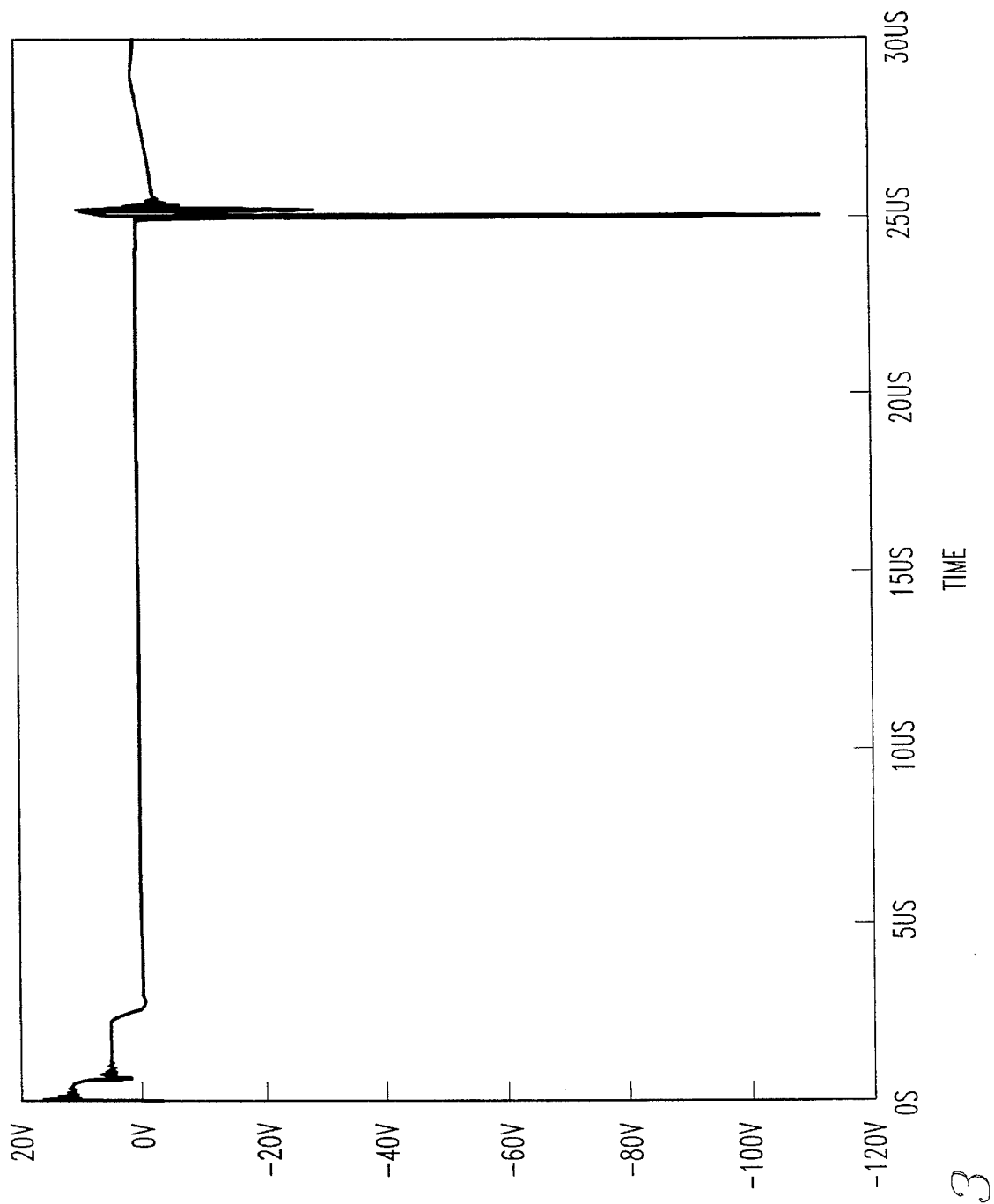
FIG. 3 is a computer simulated graph illustrating the differential voltage on the drain terminals of the circuits of FIG. 1 without the benefit of the present invention over two on-off cycles.

FIG. 3 illustrates the differential drain voltage between terminals 30 and 38 during an entire cycle without the benefit of the transition transformer 60 of the present invention. Of interest, are the two perturbations. The first one is the turn-on transition while the second is the turn-off transition. This invention makes use of the fact that this differential voltage is indicative of mismatch in the current sharing of transistors 26 and 28.

Figure 4:
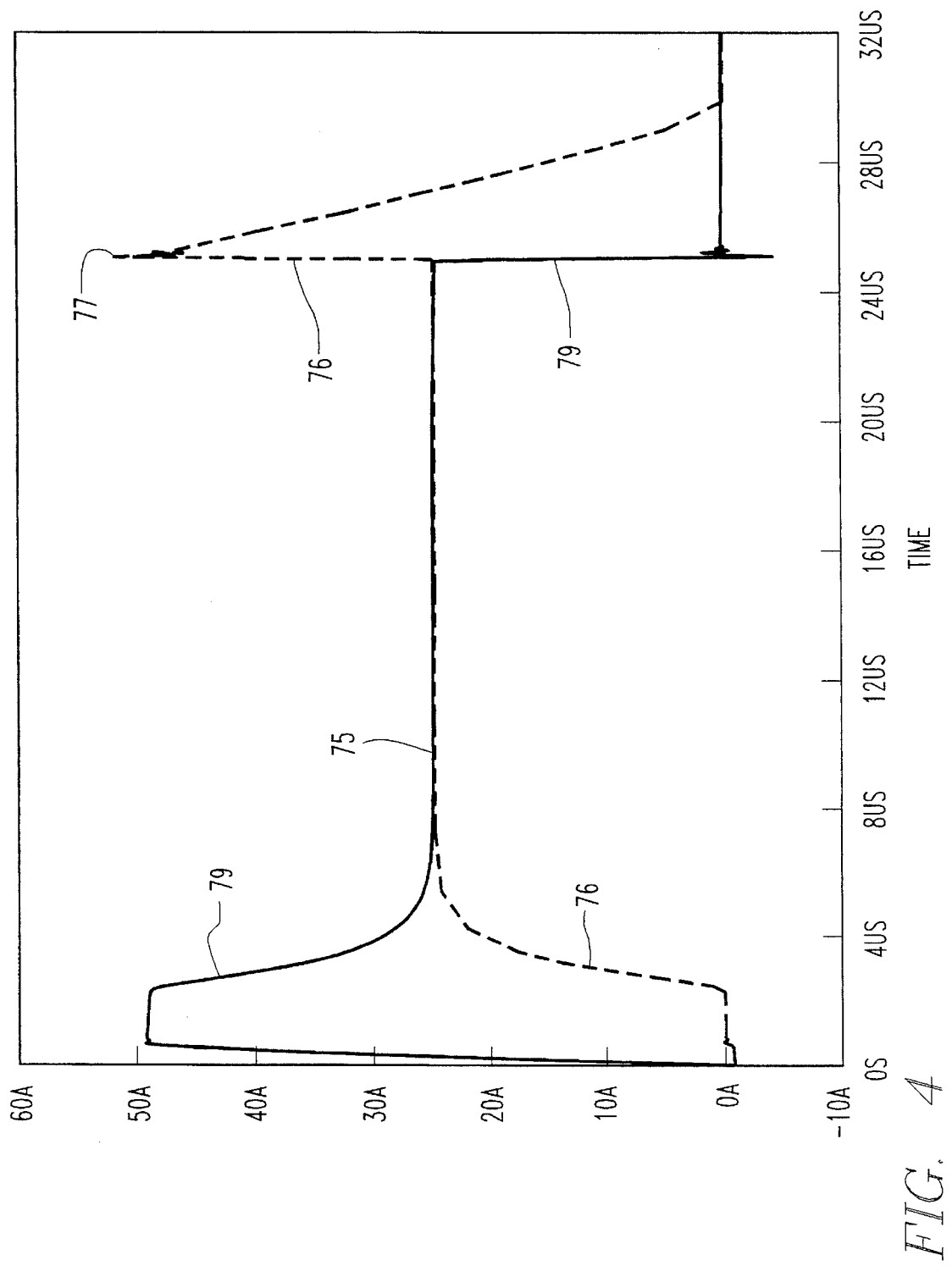
FIG. 4 is a computer simulated graph illustrating the current in the drain of the transistors M1 and M2 without the benefit of the present invention.

FIG. 4 illustrates the current in the drain of both transistor 26 and transistor 28 without the benefit of the present invention. Line 79 of FIG. 4 represents the current in the drain of transistor 28 while the current in the drain of transistor 26 is represented by the line 76 of FIG. 4. The initial current slug conducted by transistor 28 is almost 50A. Since 26 and 28 are 30A transistors, this current slug is in excess of the rating of the transistor; this would cause damage to the device. However, after the transistor 26 turns on, a current of approximately 25 amps each is shared by the transistors 26 and 28 as represented at 75 of the drawing. Thus, the transistor 28 pays the penalty for being faster during turn on. During turn off, the transistor 26 pays the penalty for being slower as it takes a current pulse in excess of 50 amps as noted at point 77.

A more detailed description of the invention will be given in connection with its operation. Assuming that the power switch 20 is on the off state, the device 20 is turned on by applying a potential to the gate drive 72. During transition, the mismatch in transistor speed, causes a differential voltage across the drain terminals. This differential voltage is used to drive a correction voltage onto the control terminals 48 and 50. As previously mentioned, the transistor 26 turns on slower, therefore the drain voltage lags that of the faster transistor 28. Therefore, the differential voltage between the drains of the transistor makes the non-dot side of the primary winding 62 connecting the drain terminal 30 through the capacitor 64 positive with respect to the side of the primary winding connected to the terminal 38 of the transistor 28. Thus, the secondary winding 70 generates a more positive voltage on the gate 48 of the transistor 26 and reduces the gate voltage on gate 50 of the transistor 28. This speeds up the operation of the transistor 26 and slows down the operation of the transistor 28 such that both the transistors 26 and 28 turn on at roughly the same speed. The capacitor 64 allows the differential drain voltage, during transition, to activate the transformer 60 but makes the transformer primary winding 62 invisible to the circuit 20 during steady state operation. The secondary winding 70 shorts the terminals 48 and 50 of the transistors 26 and 28 to the same voltage during steady state. As above mentioned, the capacitor 64 in series with the primary causes the primary winding 62 of the transformer to be out of the circuit during steady state operation. Thus, the transition transformer 60 solves the problem of current sharing by parallel connected switching transistors by forcing mismatched devices to move together through the transition region. The present invention forces the two large switches such as 26 and 28 to act as closely matched devices during the switching transition region.

Figure 5:
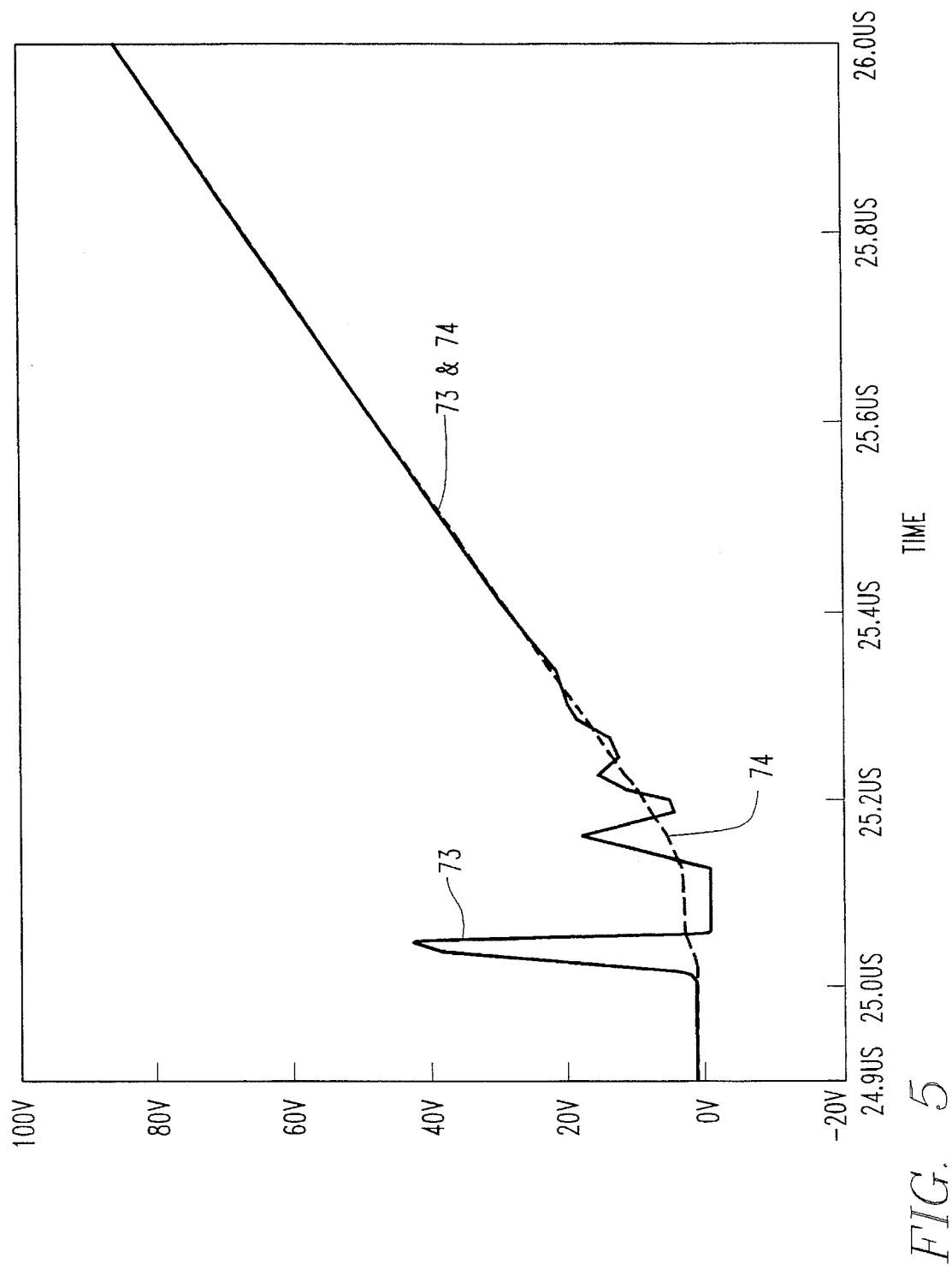
FIG. 5 is a computer simulated graph illustrating the voltage on the drains of the two transistors during transition with the benefit of the present invention.
Figure 6:
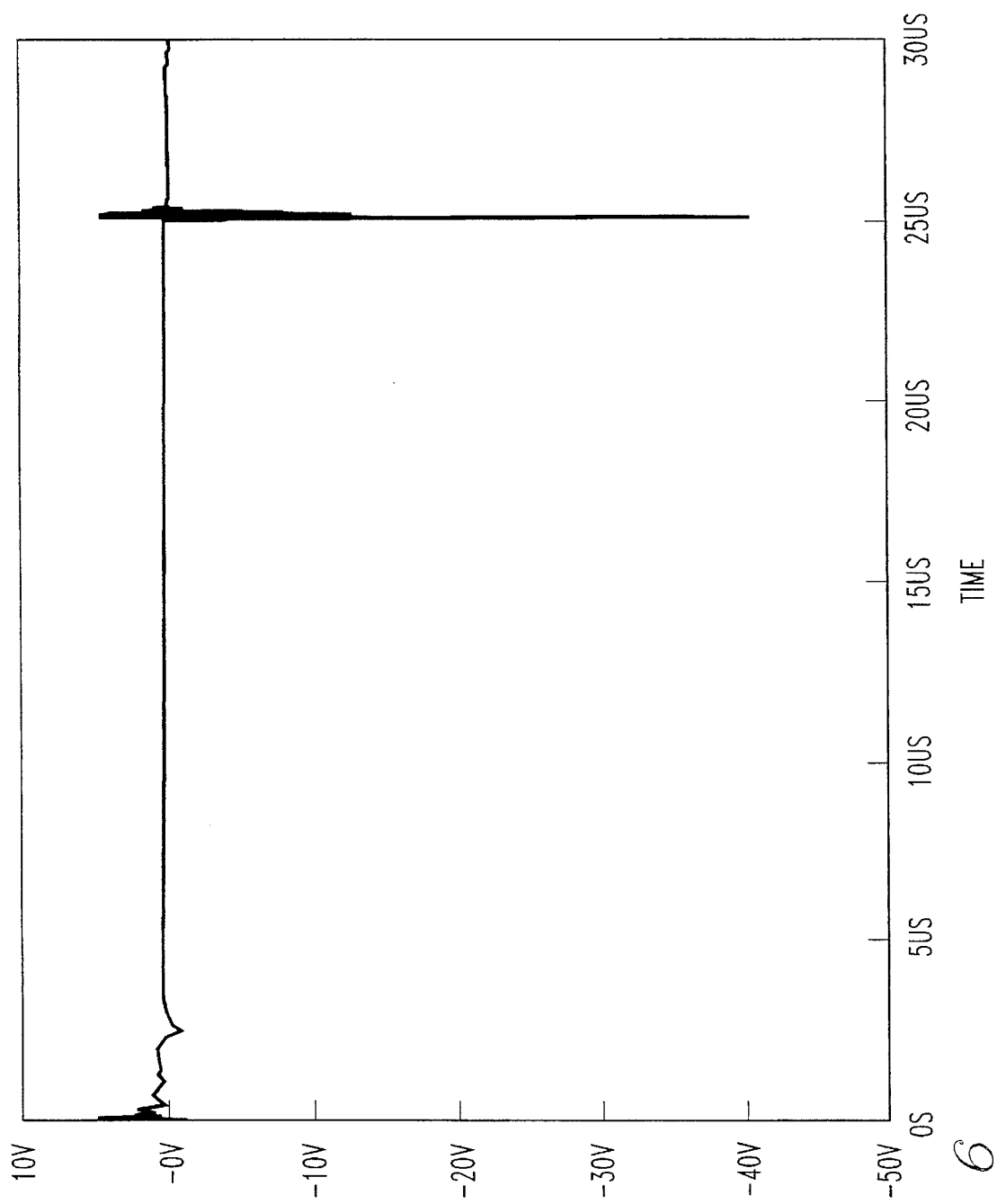
FIG. 6 is a computer simulated graph illustrating the differential drain voltage applied to the primary of the transformer in accordance with the present invention.

With the benefit of the invention, and referring to FIG. 5, line 73 represents the drain voltage (node 38) of 28 during a turn-off transition. Line 74 represents the drain voltage (node 30) during the same turn-off transition. Of particular interest is the fact that during the steady state of the transition, these voltages are almost exactly the same; this indicates that the currents are equal. This graph should be compared against FIG. 2 where the sharing was not equal. Referring to FIG. 6, the graph represents the voltage difference across the capacitor 64 and primary winding 62 of the transformer 60. Instead of the differential voltage being almost 120 volts as shown in FIG. 2, the voltage differential is approximately 40 volts for both transistors 26 and 28. If this graph is compared against the graph in FIG. 3, the nulling of this differential voltage can be seen.

Figure 7:
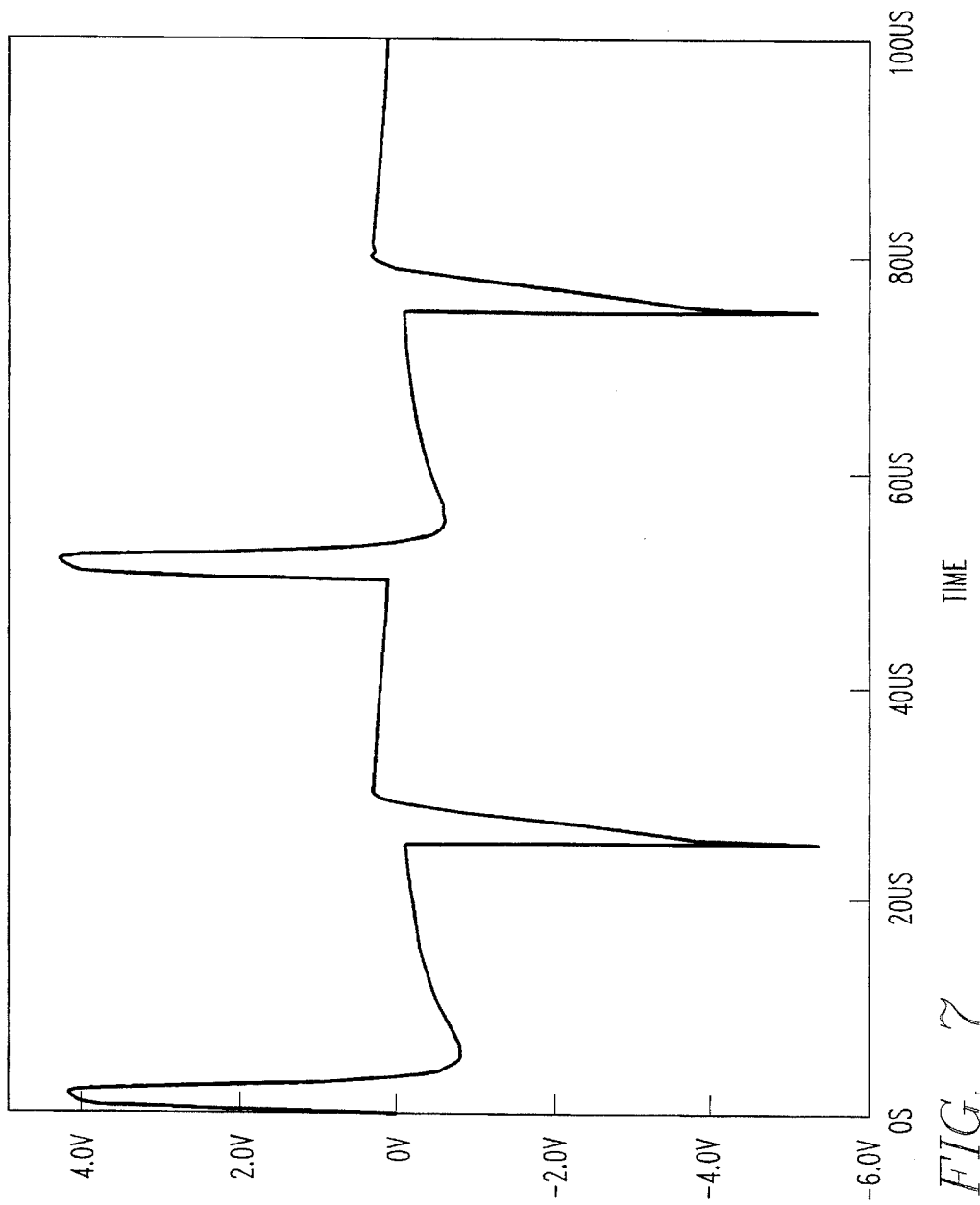
FIG. 7 is a computer simulated graph illustrating the secondary correcting voltage for driving the gates of the parallel connected transistors with the benefit of the present invention.
Figure 8:
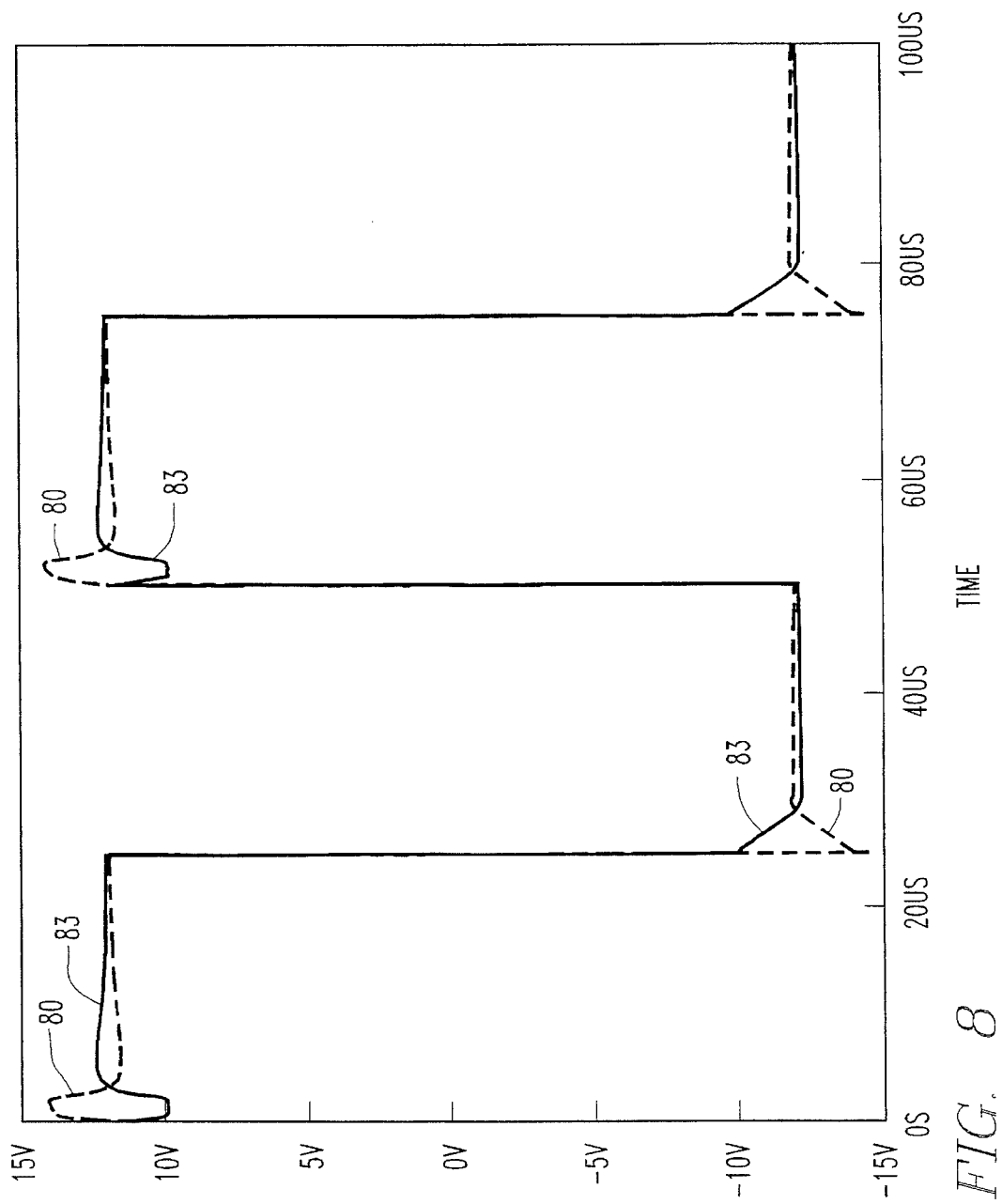
FIG. 8 is a computer simulated graph illustrating the voltages applied to the gates of the transistors during switching with the benefit of the present invention.
Figure 9:
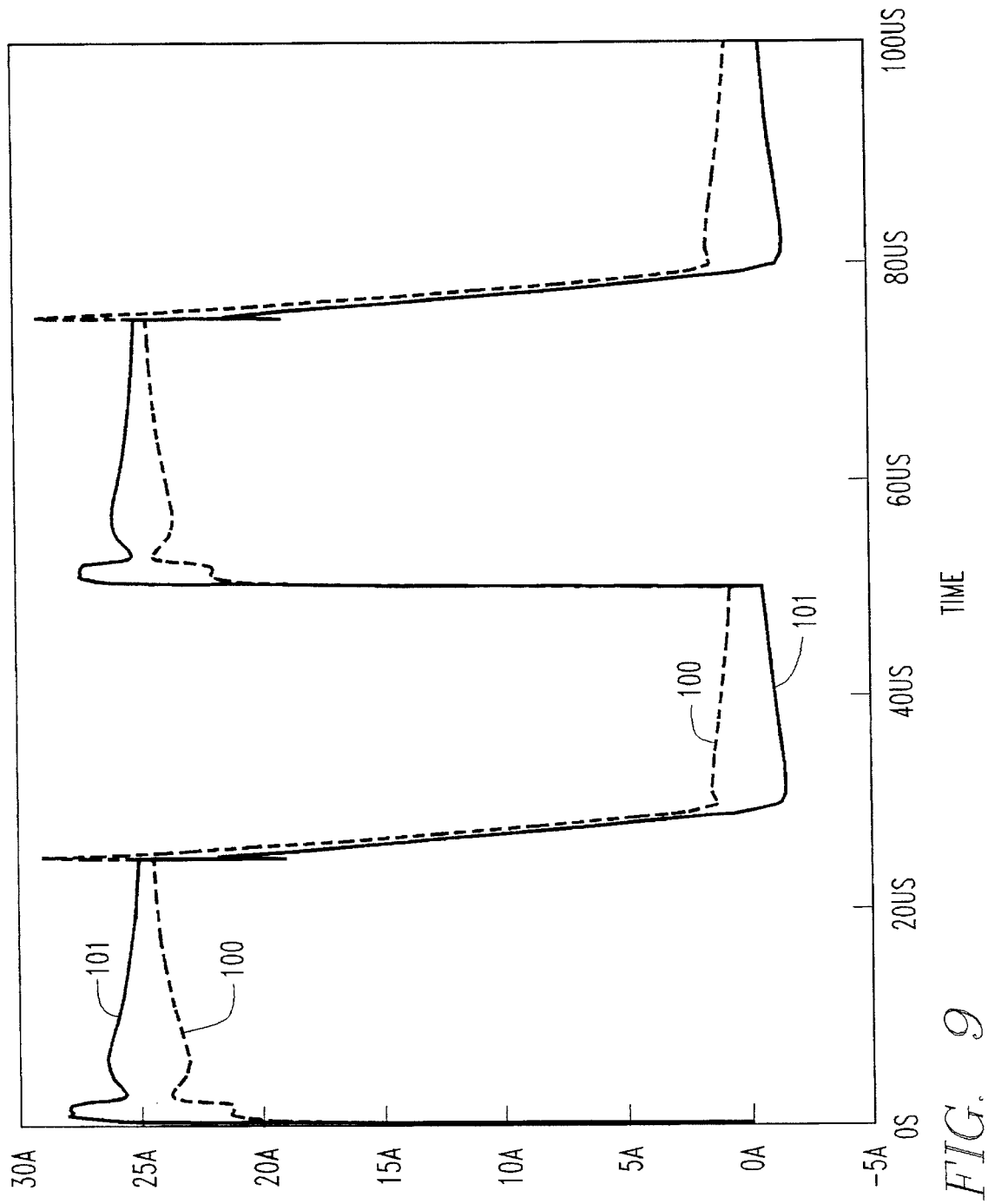
FIG. 9 is a computer simulated graph illustrating the drain current wave forms of the transistor switching devices of FIG. 1 with the benefit of the present invention.

FIG. 7 is a diagram illustrating the resulting secondary correcting voltage at gates 48 and 50 of the transistors 26 and 28 for driving the gates over two on-off cycles. The diagram of FIG. 7 can be considered a time record of the correction voltage needed to force the two switches to go through transition together in order to force current sharing through the transition stage. The differential voltage for this diagram was taken across the secondary winding 70 of the transformer. The diagram of FIG. 8 illustrates the voltages applied to the gates 48 and 50 during the switching of the two transistors over two on-off cycles. The voltage at node 48 is referred to at 80 while 83 is the voltage at node 50. FIG. 9 is a graph illustrating the current wave forms of the switching devices 26 and 28 over two on-off cycles. The current through the drain of transistor 26 is referred to at 100 while 101 is the drain current of transistor 28. It can be seen that the gross current mismatch of FIG. 4 has been reduced with the addition of the transition transformer. As seen from the graph of FIG. 9, the correction, due to the operation of the transition transformer 60, is sufficient to maintain the currents below the 30 amp peak during transition. Although the switching current 20 is described in conjunction with the use of MOS field effect transistors, it is also suitable for switching devices such as IGBT's, BJT's and JFET's.

It will be apparent to those skilled in the art that various modifications and variations can be made in the circuit and method of the present invention without departing from the spirit or scope of the invention. Thus, it is intended that the present invention cover the modifications and variations of this invention provided they come within the scope of the appended claims and their equivalents.

I claim:

1. A method of force sharing current in a plurality of parallel connected transistor switches during transition between an off and on state, the method comprising activating a primary winding of a transformer that is connected across respective corresponding elements of the plurality of transistor switches in response to a differential voltage between load terminals of the switches; and equalizing a rate of change in the plurality of transistors during the transition in response to an inductance in a secondary winding of the transformer that is connected across gating elements of the plurality of transistors.

2. The method of claim 1 further comprising shorting the gating elements of the plurality of transistors to the same steady state voltage upon termination of the transition.

3. The method of claim 1 further comprising deactivating the primary winding upon termination of the transition.

4. The method of claim 1 wherein the step of equalizing comprises generating via the secondary winding a more positive voltage on the gate of one transistor than on the gate of the other of the plurality of transistor switches.

5. A solid state switching circuit, comprising a plurality of transistor switches, each having a first element and a second element for completing a circuit when the transistor is on and for interrupting a circuit when the transistor is off, each said transistor having a third element for selectively switching the transistor to on and off, a first element being commonly connected electrically, the second elements being commonly connected electrically, and the third elements being commonly connected electrically; and a transformer having a primary winding in series with a capacitor connected at one end to the first element of one of the plurality of transistors and at the opposite end to the first element of another of the plurality of transistors, the transformer having a secondary winding connected at one end to the third element of one of the plurality of transistors, and the opposite end to the third element of the other of the plurality of transistors.

6. The switching circuit of claim 5 wherein the first element of each of the transistors is a drain electrode of a field effect transistor and the third element of each of the transistors is a gate electrode of the field effect transistor.

7. A switching circuit comprising:

a transformer having a primary and secondary winding;

a first switching transistor having a first terminal connected to one end of said primary winding and a second terminal connected to one end of said secondary winding; and a second switching transistor having a first terminal connected to the other end of said primary winding and a second terminal connected to the other end of said secondary winding, said primary winding comprising a capacitor in series with the primary winding.

8. A method of force sharing current in switching transistors comprising the steps of:

providing switching transistors with common terminals connected by the primary winding of a transformer;

detecting a voltage difference across the primary winding when at least one of said switching transistors is in transition;

simultaneously increasing the switch time of the slower switching transistor and decreasing the switch time of the faster switching transistor based upon the voltage difference detected, whereby the switch time difference between the switching transistors is decreased.

* * * * *